United States Patent
Wolter et al.

(10) Patent No.: US 11,984,246 B2
(45) Date of Patent: May 14, 2024

(54) VERTICAL INDUCTOR FOR WLCSP

(71) Applicant: Intel Corporation, Santa Clara, CA (US)

(72) Inventors: Andreas Wolter, Regensburg (DE); Thorsten Meyer, Regensburg (DE); Gerhard Knoblinger, Villach (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/566,529

(22) Filed: Dec. 30, 2021

(65) Prior Publication Data
US 2022/0122756 A1  Apr. 21, 2022

Related U.S. Application Data

(60) Continuation of application No. 16/993,152, filed on Aug. 13, 2020, now Pat. No. 11,250,981, which is a (Continued)

(51) Int. Cl.
  *H01F 17/00* (2006.01)
  *H01F 41/04* (2006.01)
  (Continued)

(52) U.S. Cl.
  CPC ....... *H01F 17/0033* (2013.01); *H01F 41/046* (2013.01); *H01L 23/5227* (2013.01);
  (Continued)

(58) Field of Classification Search
  CPC ............... H01F 17/0033; H01F 41/046; H01F 2017/0086; H01F 2017/2814;
  (Continued)

(56) References Cited

U.S. PATENT DOCUMENTS 7,381,483 B2  6/2008  Cheng
9,276,140 B1*  3/2016  Tam .................. H01L 27/14625
(Continued)

FOREIGN PATENT DOCUMENTS

CN  1669139  9/2005
EP  1114428  7/2001
(Continued)

OTHER PUBLICATIONS

Office Action from Chinese Patent Application No. 201580081209.8 dated Aug. 25, 2022, 18 pgs., no translation.
(Continued)

*Primary Examiner* — Hoai V Pham
(74) *Attorney, Agent, or Firm* — Schwabe, Williamson & Wyatt, P.C.

(57) ABSTRACT

Embodiments of the invention include a microelectronic device and methods of forming a microelectronic device. In an embodiment the microelectronic device includes a semiconductor die and an inductor that is electrically coupled to the semiconductor die. The inductor may include one or more conductive coils that extend away from a surface of the semiconductor die. In an embodiment each conductive coils may include a plurality of traces. For example, a first trace and a third trace may be formed over a first dielectric layer and a second trace may be formed over a second dielectric layer and over a core. A first via through the second dielectric layer may couple the first trace to the second trace, and a second via through the second dielectric layer may couple the second trace to the third trace.

13 Claims, 9 Drawing Sheets

Related U.S. Application Data division of application No. 16/367,200, filed on Mar. 27, 2019, now Pat. No. 10,784,033, which is a division of application No. 15/036,786, filed as application No. PCT/US2015/037834 on Jun. 25, 2015, now Pat. No. 10,290,412.

(51) Int. Cl.
*H01L 23/00* (2006.01)
*H01L 23/522* (2006.01)
*H01L 23/64* (2006.01)
*H01F 27/28* (2006.01)

(52) U.S. Cl.
CPC ............ *H01L 23/645* (2013.01); *H01L 24/17* (2013.01); *H01F 2017/0086* (2013.01); *H01F 2027/2814* (2013.01); *H01L 24/13* (2013.01); *H01L 24/16* (2013.01); *H01L 2224/0345* (2013.01); *H01L 2224/03462* (2013.01); *H01L 2224/03464* (2013.01); *H01L 2224/0401* (2013.01); *H01L 2224/05647* (2013.01); *H01L 2224/11* (2013.01); *H01L 2224/1132* (2013.01); *H01L 2224/11334* (2013.01); *H01L 2224/11462* (2013.01); *H01L 2224/16265* (2013.01); *H01L 2224/16267* (2013.01); *H01L 2224/1703* (2013.01); *H01L 2224/171* (2013.01); *H01L 2924/19042* (2013.01); *H01L 2924/19104* (2013.01); *H01L 2924/19107* (2013.01)

(58) Field of Classification Search
CPC ... H01L 23/5227; H01L 23/645; H01L 24/13; H01L 24/16; H01L 24/17; H01L 2224/0345; H01L 2224/03462; H01L 2224/03464; H01L 2224/0401; H01L 2224/05647; H01L 2224/11; H01L 2224/1132; H01L 2224/11334; H01L 2224/11462; H01L 2224/16265; H01L 2224/1703; H01L 2224/171; H01L 2224/19042; H01L 2224/19104; H01L 2224/19107
USPC .................................................. 257/277, 531
See application file for complete search history.

(56) References Cited

U.S. PATENT DOCUMENTS

| | | |
|---|---|---|
| 2003/0038366 A1 | 2/2003 | Kozono |
| 2004/0208032 A1 | 10/2004 | Edo |
| 2005/0122198 A1 | 6/2005 | Zhou et al. |
| 2005/0285262 A1* | 12/2005 | Knapp ............... H01L 24/48 257/E23.033 |
| 2006/0113645 A1 | 6/2006 | Warner et al. |
| 2007/0217174 A1 | 9/2007 | Shen |
| 2008/0309442 A1 | 12/2008 | Herbert |
| 2009/0188104 A1 | 7/2009 | Ching |
| 2010/0033236 A1 | 2/2010 | Triantafillou |
| 2011/0279214 A1 | 11/2011 | Lee et al. |
| 2013/0307117 A1 | 11/2013 | Koduri |
| 2015/0162297 A1* | 6/2015 | Cho ..................... H02M 3/155 257/76 |
| 2015/0237461 A1* | 8/2015 | Goyal ................... H04M 1/02 455/41.2 |

FOREIGN PATENT DOCUMENTS

| | | |
|---|---|---|
| JP | S52-046787 | 4/1977 |
| JP | S56-125866 | 10/1981 |
| JP | H08-250332 | 9/1996 |
| JP | 2002-100733 | 4/2002 |
| JP | 2007-150022 | 6/2007 |
| JP | 2007-281230 | 10/2007 |
| JP | 2009-038297 | 2/2009 |

OTHER PUBLICATIONS

Search Report and Written Opinion for International Patent Application No. PCT/US2015/037834, dated Jun. 25, 2015, 14 pages.
International Preliminary Report on Patentability for International Patent Application No. PCT/US2015/037834, dated Jan. 4, 2018, 11 pages.
Extended European Search Report for European Patent Application No. 15896532.7 dated Feb. 15, 2019, 10 pgs.
Office Action from Japanese Patent Application No. 2017-560262, dated Feb. 19, 2019, 12pgs.
Office Action from Japanese Patent Application No. 2017-560262, dated Nov. 5, 2019, 4 pgs.
Office Action from Taiwan Patent Application No. 105112433, dated Sep. 17, 2019, 7 pgs.
Office Action from European Patent Application No. 15896532.7 dated Jun. 10, 2020, 7 pgs.
Office Action from China Patent Application No. 201580081209.8 dated Aug. 11, 2020, 16 pgs.
Notice of Allowance from Taiwan Patent Application No. 105112433, dated Feb. 15, 2020, 3 pgs.
Office Action from Korean Patent Application No. 2018-7002365 dated Feb. 24, 2021, 8 pgs., with English translation.
Office Action from China Patent Application No. 201580081209.8 dated Apr. 7, 2021, 23 pgs.
Office Action from Korean Patent Application No. 10-2018-7002365 dated Apr. 26, 2021, 3 pgs.
Notice of Allowance from Korean Patent Application No. 10-2018-7002365 dated Jul. 2, 2021, 3 pgs.
Notice of Allowance from Chinese Patent Application No. 201580081209.8 dated Nov. 30, 2021, 8 pgs.
Office Action from Chinese Patent Application No. 201580081209.8 dated Jun. 29, 2022, 13 pgs., with English translation.
Notice of Allowance from European Patent Application No. 15896532.7, dated Feb. 16, 2023, 2 pgs.

* cited by examiner

VERTICAL INDUCTOR FOR WLCSP

PRIORITY

This application is a Continuation of U.S. patent application Ser. No. 16/993,152, filed Aug. 13, 2020, which is a Divisional of U.S. patent application Ser. No. 16/367,200, filed Mar. 27, 2019, now U.S. Pat. No. 10,784,033, issued Sep. 22, 2020, which is a Divisional of U.S. patent application Ser. No. 15/036,786, filed on May 13, 2016, now U.S. Pat. No. 10,290,412, issued May 14, 2019, entitled VERTICAL INDUCTOR FOR WLCSP, which is a U.S. National Phase Application under 35 U.S.C. § 371 of International Application No. PCT/US2015/037834 filed Jun. 25, 2015, entitled "VERTICAL INDUCTOR FOR WLCSP," the entire contents of which are hereby incorporated by reference herein.

FIELD OF THE INVENTION

Embodiments of the present invention relate generally to the manufacture of semiconductor devices. In particular, embodiments of the present invention relate to the inductors for semiconductor devices and methods for manufacturing such devices.

BACKGROUND OF THE INVENTION

Inductors are a key element of RF-circuits for wireless platforms. Generally, inductors are formed on the surface of the semiconductor chip. However, forming an inductor on the chip surface results in unwanted coupling between the inductor and the circuitry in the die and reduces valuable surface area on the semiconductor chip. Accordingly, it is desirable to replace on-chip inductors with inductors that are integrated into the device packaging. In wafer level chip size packages (WLCSPs), the inductors that are integrated into the package are typically planar inductors. In a planar inductor, the plane of the conductive coil is substantially parallel to the surface of the semiconductor die to which the inductor is connected. Since the device package does not extend beyond the outer perimeter of the semiconductor chip in WLCSPs, planar inductors that are formed in the packaging of WLCSPs have disadvantages that are similar to on-chip inductors. First, in a planar inductor the majority of the magnetic flux lines penetrate into the surface of the semiconductor die. The magnetic flux lines formed by the inductor induce eddy currents that couple back to the inductor and result in an unwanted reduction in the quality factor of the inductor. Additionally, the conductive coil of a planar inductor is located close to the surface of the semiconductor die. The close proximity of the conductive coil to the die surface produces undesirable capacitive coupling between the semiconductor die and the inductor.

One approach to form non-planar inductors has been to use wirebonding techniques to form the conductive coils of the inductor. However, wirebonding coils directly to the surface of the semiconductor die causes significant mechanical stress to the surface of the die. Modern chip technologies use fragile low and ultra low-k dielectrics in the back end of line (BEOL) stack. In many cases the risk of damaging the BEOL-stack by wirebonding is considered too high.

DETAILED DESCRIPTION OF THE INVENTION

Figure 1A:
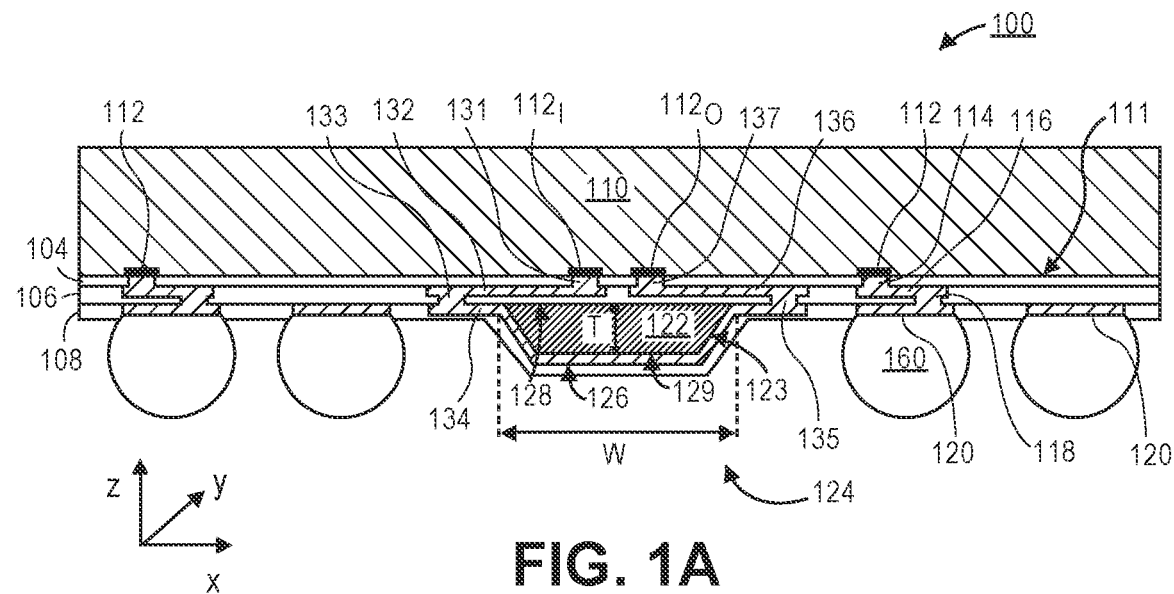
FIG. 1A is a cross-sectional illustration of a microelectronic device with an inductor formed around a core, according to an embodiment of the invention.

Described herein are systems that include vertically oriented inductors and methods of forming such devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention include microelectronic devices that include one or more vertically oriented inductors. As used herein, a vertically oriented inductor is an inductor that has one or more conductive coils that are formed along a plane that is not substantially parallel to the surface of the semiconductor die to which the inductor is connected. For example, embodiments of the invention may include a vertically oriented inductor that has one or more coils that are formed along a plane that is substantially orthogonal to the surface of the semiconductor die to which the inductor is connected. The vertical orientation of the inductor reduces the magnetic flux lines that penetrate into the surface of the semiconductor die compared to a planar inductor, such as those described above. As such, eddy currents in the semiconductor die are reduced and the quality factor of the inductor is increased. Furthermore, the vertical orientation increases the distance between the conductive coil of the inductor and the semiconductor die compared to the distance separating the two components in a planar inductor. Therefore, the capacitive coupling between the semiconductor die and the inductor is reduced, relative to a planar inductor.

Embodiments of the invention allow for the incorporation of one or more vertical inductors without substantially reducing throughput or increasing the cost of production. The throughput is not substantially reduced, because the processing operations used to form the inductor are already used to form the redistribution layers needed for connecting the solder bumps to the contacts on the die surface. For example, in a microelectronic device that includes two redistribution layers, the first redistribution layer may be used for a bottom portion of a conductive coil, and the second redistribution layer may be used for an upper portion of a conductive coil. Since the processing operations and materials needed to form the vertical inductors may already be used to form the redistribution layers for packaging the microelectronic device, there is not a substantial increase to the cost or decrease in the throughput when forming a vertical inductor in accordance with embodiments of the invention.

Referring now to FIG. 1A, a cross-sectional illustration of a microelectronic device 100 is shown, according to an embodiment of the invention. The microelectronic device 100 may include a semiconductor die 110. The semiconductor die 110 may include device circuitry (not shown). In one embodiment, the semiconductor die may be a crystalline substrate formed using a bulk silicon or a silicon-on-insulator substructure. In other implementations, the semiconductor die may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device 100 may be one of a plurality of microelectronic devices formed on a larger substrate, such as, for example, a wafer. In an embodiment, the microelectronic device may be a wafer level chip size package (WLCSP). In certain embodiments, the microelectronic device 100 may be singulated from the wafer subsequent to packaging operations, such as, for example, the formation of one or more vertically oriented inductors and/or the attachment of one or more solder bumps.

One or more contacts 112 may be formed on a surface 111 of the semiconductor die 110. The contacts 112 may include one or more conductive layers. By way of example, the contacts 112 may include barrier layers, organic surface protection (OSP) layers, metallic layers, or any combination thereof. The contacts 112 may provide electrical connections to active device circuitry (not shown) within the semiconductor die 110. The contacts 112 may each be electrically coupled to the device circuitry by the back end of line (BEOL) stack that includes one or more alternating layers of conductive traces and low-k dielectric materials (not shown).

Embodiments of the invention include one or more solder bumps 160 that are each electrically coupled to a contact 112. The solder bumps 160 may be electrically coupled to the contacts 112 by one or more redistribution layers and conductive vias. In the embodiment illustrated in FIG. 1A, the solder bumps 160 are electrically coupled to the contacts 112 by a first via 114, a first redistribution layer 116, a second via 118, and a second redistribution layer 120. While the illustrated embodiment includes two redistribution layers, it is to be appreciated that embodiments of the invention are not limited to such configurations and may include one or more redistribution layers. According to an embodiment, the first and second redistribution layers and the first and second vias may be a conductive material, such as a copper layer. According to embodiments, the redistribution layers and the vias may include a single metal layer, a stack of different metal layers, or alloys. For example, the redistribution layer may include barrier layers, seed layers, or the like.

The redistribution layers may be separated from each other by one or more dielectric layers. In the illustrated embodiment, the first redistribution layer 116 is formed over a first dielectric layer 104, and a second dielectric layer 106 separates the first redistribution layer 116 from the second redistribution layer 120. The first vias 114 formed through the first dielectric layer 104 may electrically couple the first redistribution layer 116 to the contacts 112, and the second vias 118 formed through the second dielectric layer 106 may electrically couple the first redistribution layer 116 to the second redistribution layer 120. By way of example, the dielectric layers 104 and 106 may be any suitable dielectric material. In an embodiment, the dielectric layers may be a polymer material, such as, for example, polyimide, epoxy, or Ajinomoto build-up film (ABF). According to an embodiment, a solder resist 108 may also be formed over portions of the second dielectric layer 106 and over portions of the second redistribution layer 120 in order to prevent corrosion and short-circuiting.

In an embodiment, the microelectronic device 100 includes one or more inductors 124. The inductor 124 is electrically coupled to the device circuitry within the semiconductor die 110 by an input contact $112_I$ and an output contact $112_O$. Embodiments of the invention include an inductor 124 with one or more conductive coils 126 formed around a core 122. In one embodiment, the one or more conductive coils 126 of the inductor 124 may be formed from a plurality of conductive traces and vias. In the embodiment illustrated in FIG. 1A, the conductive coil 126 comprises a first conductive via 131, a first trace 132, a second conductive via 133, a second conductive trace 134, a third conductive via 135, a third conductive trace 136, and a fourth conductive via 137. By way of example, the first conductive via 131 electrically couples the input contact $112_I$ to the first trace 132. The second conductive via 133 electrically couples the first trace 132 to the second trace 134. The third conductive via 135 electrically couples the second trace 134 to the third trace 136, and the third trace 136 may be electrically coupled to the output contact $112_O$ by the fourth via 137. It is to be appreciated that the number of vias and traces used to form the conductive coil 126 may be greater than or less than the number of traces and vias illustrated in FIG. 1A, according to different embodiments.

In an embodiment, the plurality of traces and vias used to form the conductive coil 126 are formed during the same processing operations used to form the redistribution layers and vias used to electrically couple solder bumps 160 to the contacts 112. For example, the first via 131 and the fourth via 137 may be formed through the first dielectric lay 104 during the formation of vias 114. Additionally, the first conductive trace 132 and third conductive trace 136 may be formed over the first dielectric layer 104 during the formation of the first redistribution layer 116. The second via 133 and third via 135 may be formed through a second dielectric layer 106 during the formation of vias 118. The second trace 134 may be formed during the formation of the second redistribution layer 120. Accordingly, the conductive traces and vias of the inductor 124 may be formed with the same materials as the redistribution layers 118 and 120.

According to an embodiment, the inductor 124 is oriented vertically with respect to a surface 111 of the semiconductor die 110. For example, the conductive coil 126 of the inductor 124 is formed substantially along the X-Z plane and the surface 111 of the semiconductor die 110 is formed along the X-Y plane. The vertical orientation of the inductor 124 reduces the magnetic flux lines that penetrate into the surface of the semiconductor die 110 compared to a planar inductor, such as those described above. As such, eddy currents in the semiconductor die 110 are reduced and the quality factor of the inductor 124 is increased. Additionally, the conductive coil 126 is spaced further from the semiconductor die 110 and, therefore, decreases the capacitive coupling between the semiconductor die 110 and the inductor 124.

The inductivity of the inductor 124 scales with the area enclosed by the conductive coil 126. Accordingly, embodiments of the invention include a core 122 that increases the area enclosed by the conductive coil 126. According to an embodiment, a first surface 128 of the core 122 may be formed over the second dielectric layer 106 with sidewalls 123 that extend away from the second dielectric layer 106 until they reach a second surface 129 of the core 122. While the illustrated embodiment shows the second surface 129 as being substantially parallel with the first surface 128, it is to be appreciated that embodiments are not limited to such configurations. For example, the second surface 129 may be rounded.

The core 122 increases the enclosed area by causing a portion of the second trace 134 to be diverted away from the second dielectric layer 106 in the Z-direction. In the illustrated embodiment, the second trace 134 is formed partially along the second dielectric layer 106 and along the sidewalls 123 and over the second surface 129 of the core 122. In such embodiments, the area enclosed by the conductive coil 126 may comprise the cross-sectional area of the core 122 and a portion of the second dielectric layer 106, as illustrated in FIG. 1A. The area enclosed by the inductor 124 can be increased or decreased by altering the geometry of the core 122. For example, a thickness T of the core, the width W of the core, and/or the slope/shape of the sidewalls 123 may be modified to provide a desired inductivity for the inductor 124.

According to an embodiment of the invention, the core 122 may be formed with one or more materials. In one embodiment, the core 122 may be a composite material. By way of example, the composite matrix may be epoxy, polyimide, benzocyclobutene (BCB), or the like, and filler materials for the composite may include ferrites (e.g., NiZn ferrites, or MnZn ferrites), or magnetic particles or nanoparticles that include one or more of Ni, Fe, or Co. Additional embodiments of the invention may include a single material for the core 122. For example, the core may be Ni or Co. As will be described in greater detail below, the core 122 may be formed with a screen printing process, a jet printing process, a sputtering process, or the like. The shape of the core 122 may be dependent on the process and materials used to form the core 122. For example, in a printing operation the sidewalls 123 of the core 122 may slump and form curved sidewalls 123. As such, the shape of the core 122 is not limited to the shape and sizes disclosed in the figures, according to embodiments of the invention. According to embodiments of the invention, the inductivity of the inductor 124 may be modified by selecting different materials for the core 122. For example, selecting a material with a high magnetic permeability for the core 122 may increase the inductivity of the core 122 relative to core 122 formed with a material that has a relatively low magnetic permeability.

Figure 1B:
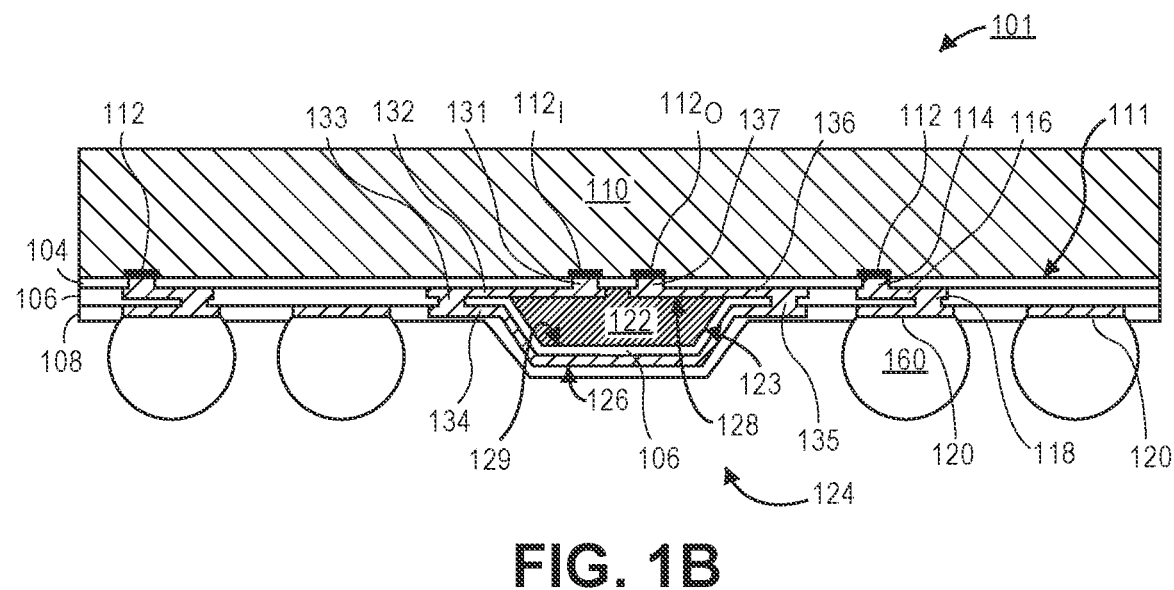
FIG. 1B is a cross-sectional illustration of a microelectronic device with an inductor formed around a core and with the core contacting the first trace and third trace of the conductive coil, according to an embodiment of the invention.

Referring now to FIG. 1B, a cross-sectional illustration of a microelectronic device 101 according to an additional embodiment is illustrated. The microelectronic device 101 is substantially similar to the microelectronic device 100 described above, with the exception that the first surface 128 of the core 122 is not formed over the second dielectric layer 106. Instead, embodiments include forming the first surface 128 of the core partially over the first trace 132, the third trace 136, and the first dielectric layer 104. In such an embodiment, the second dielectric layer 106 may be formed over the sidewalls 123 and the second surface 129 of the core 122, and the second trace 134 may be formed over the second dielectric layer 106.

Figure 1C:
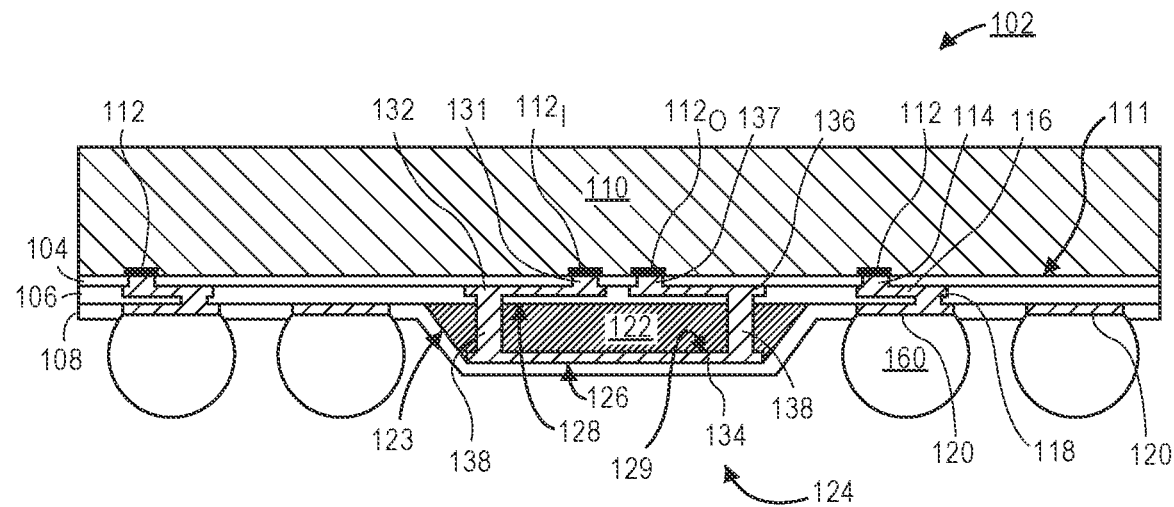
FIG. 1C is a cross-sectional illustration of a microelectronic device with an inductor with a conductive coil formed around and through a core, according to an embodiment of the invention.

Referring now to FIG. 1C, a cross-sectional illustration of a microelectronic device 102 is shown, according to an embodiment. The microelectronic device 102 is substantially similar to the microelectronic device 100 described above, with the exception that the conductive coil 126 passes through the core 122. In such embodiments, the core 122 may be formed inside of the conductive coil 126 and around portions of the conductive coil 126. As illustrated, the second trace 134 is electrically coupled to the first trace 132 and the third trace 136 by vias 138 that extend through the core 122 and the second dielectric layer 106 formed over the first trace 132 and the third trace 136. In such an embodiment, the second trace 134 does not need to extend along the sidewalls 123 of the core 122. Accordingly, inconsistencies in the slope and/or shape of the sidewalls due to variability in the processing operations and material tolerances do not alter the area enclosed by the inductor 124. The vias 138 may be laser drilled according to an embodiment. The high precision available with laser drilling allows for the area enclosed by the conductive coil 126 to be precise and highly repeatable. As such, any variation attributable to the shape and slope of the sidewalls, as described above, may be eliminated when through vias 138 are used to form the conductive coil 126 of the inductor 124.

Figure 1D:
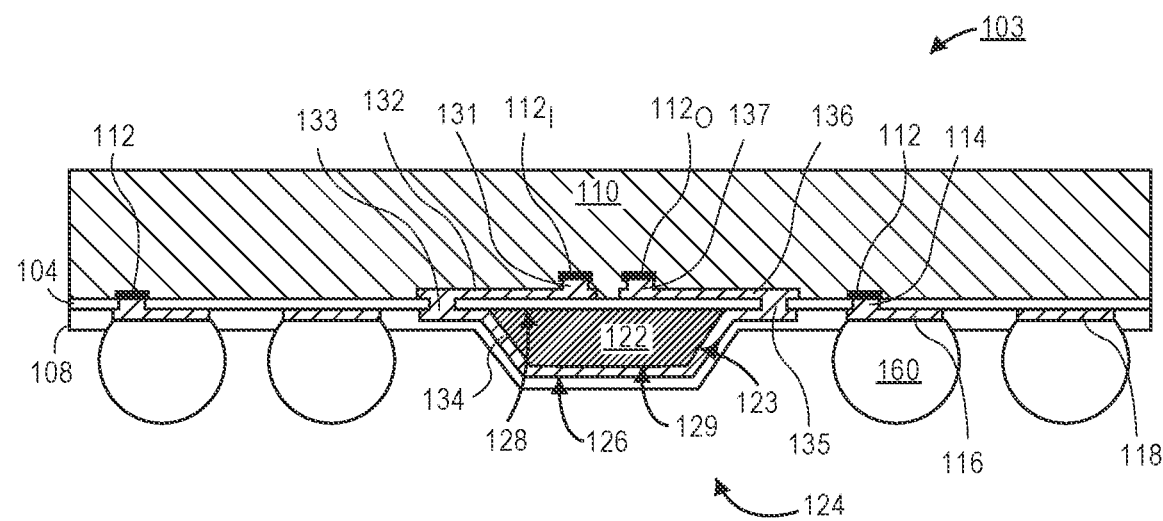
FIG. 1D is a cross-sectional illustration of a microelectronic device with an inductor formed around a core and with a portion of the inductor formed in the back end of line stack of a semiconductor die, according to an embodiment of the invention.

According to an additional embodiment of the invention, a portion of the conductive coil 126 may be formed in the BEOL-stack of the semiconductor die 110. FIG. 1D is a cross-sectional illustration of a microelectronic device 103 that includes such an inductor 124. According to an embodiment, microelectronic device 103 is substantially similar to the microelectronic device 100 described above, with the exception that the first trace 132 and the third trace 136 of the conductive coil 126 are formed in the BEOL-stack of the semiconductor die 110. In such embodiments, the traces may be formed using conventional BEOL processing operations. The inclusion of the first trace 132 and the third trace 136 in the BEOL-stack allows for the vertically oriented inductor 124 to be formed using only a single dielectric layer 104. As illustrated, the microelectronic device 103 may include packaging that has a first dielectric layer 104 and a first redistribution layer 118 formed over the first dielectric layer 104. The second trace 134 may then be formed during the same processing operations used to form the first redistribution layer 118. Thereafter, a solder resist layer 108 may be formed over the second trace 134, according to an embodiment.

Figure 2A:
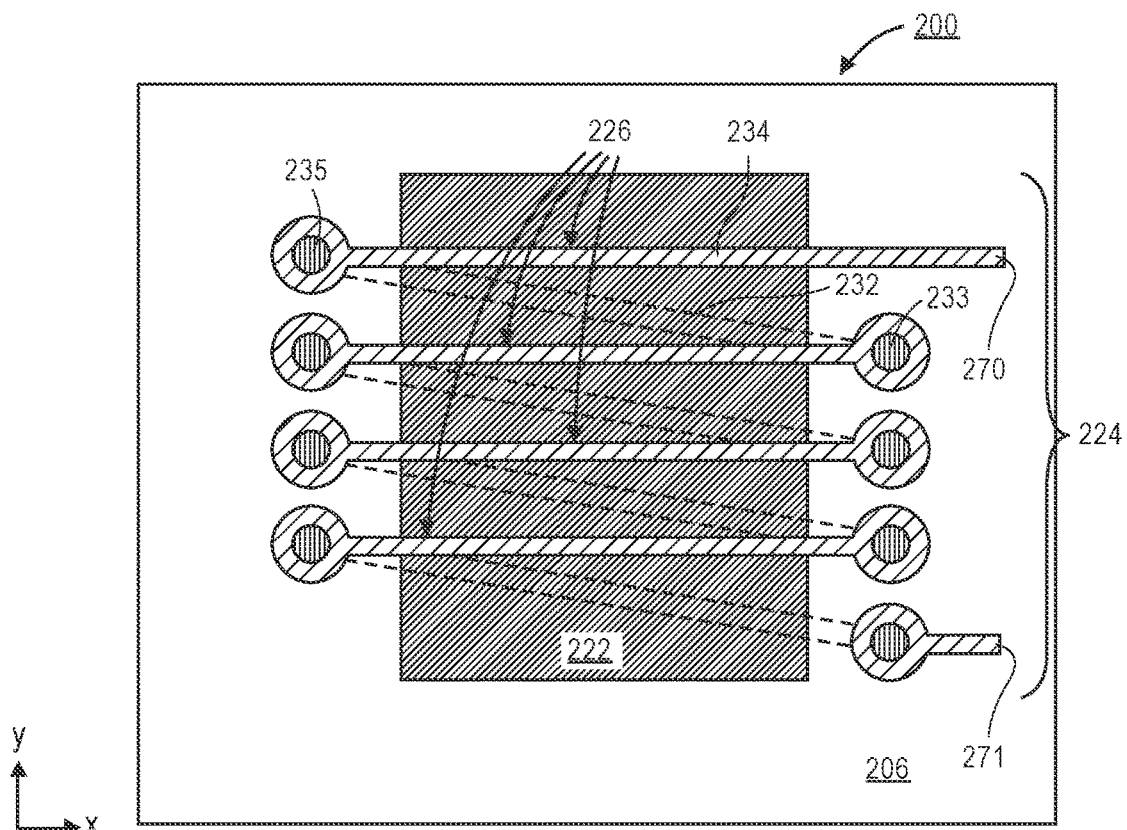
FIG. 2A is a plan view illustration of a microelectronic device with an inductor that has a plurality of conductive coils formed around a core, according to an embodiment of the invention.

The embodiments illustrated in FIGS. 1A-1D depict inductors 124 that have a single conductive coil 126. However, embodiments of the invention are not limited to such configurations. For example, an inductor may include a plurality of conductive coils. Referring now to FIG. 2A, a plan view of an inductor 224 with a plurality of conductive coils 226 that are formed on a microelectronic device 200 is shown, according to an embodiment of the invention. In FIG. 2A the contacts to the device circuitry of the microelectronic device 200 and the solder mask are omitted to not unnecessarily obscure the drawing. In an embodiment a first conductive coil 226 of the inductor 224 starts at the device input 270. From the input 270, a second trace 234 passes over the second dielectric layer 206 and then passes over the core 222. The second trace 234 may then pass along the second dielectric layer 206 on the opposite side of the core 222 until it reaches a via 235. Accordingly, the second trace 234 may be formed partially over the second dielectric layer 206 and over the surface of the core 222. It is to be appreciated that the sidewalls and the second surface of the core 222 are not distinguishable from each other in FIG. 2A, because the core 222 extends outwards in the Z-direction, which is not visible in the X-Y plane that is illustrated. In an additional embodiment, the second trace 234 may be formed only over the core 222 and may not contact the second dielectric layer 206. For example, the second trace may be not contact the second dielectric layer 206 when vias are formed through the core 222 (not shown in FIG. 2A) similar to the vias 138 illustrated in FIG. 1C.

According to an embodiment, via 235 extends through the second dielectric layer 206 to connect with a first conductive trace 232 of the conductive coil 226. The first trace 232 is outlined with dashed lines to indicate that it is formed below the core 222 and below the second dielectric layer 206. In an embodiment, the second trace 232 passes below the core 222 and connects with a second via 233. The second via 233 electrically couples the first conductive trace 232 to the next second conductive trace 234 that begins a second conductive coil 226. According to an embodiment, one or more additional conductive coils 226 may then be formed, with the last conductive coil 226 ending at an output 271. While the illustrated embodiment depicts the input 270 and the output 271 as both being formed over the second dielectric layer 206, it is to be appreciated that the input 270 and the output 271 may be formed under the second dielectric layer 206. Additional embodiments may include forming one of the input 270 and the output 271 under the second dielectric layer 206 and the other of the input 270 and the output 271 over the second dielectric layer 206.

Figure 2B:
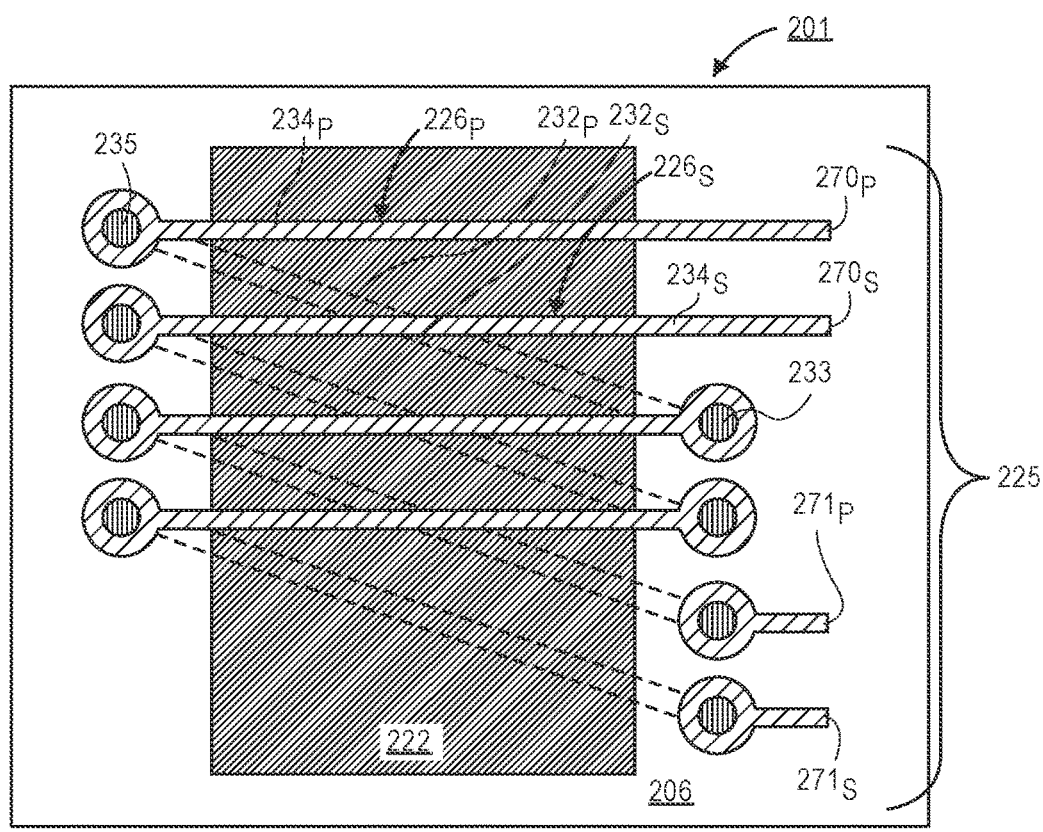
FIG. 2B is a plan view illustration of a microelectronic device with a transformer that has a plurality of conductive coils formed around a core, according to an embodiment of the invention.

Referring now to FIG. 2B, a microelectronic device 201 is illustrated that includes a primary inductor and a secondary inductor that are vertically oriented and interdigitated to form a transformer 225. As illustrated, a primary inductor includes one or more primary conductive coils $226_P$ and includes an input $270_P$ and an output $271_P$, and a secondary inductor includes one or more secondary conductive coils $226_S$ and includes an input $270_S$ and an output $271_S$. Each conductive coil $226_P$ and $226_S$ is substantially similar to the conductive coils 226 illustrated and described with respect to FIG. 2A, with the exception that the conductive coils are interdigitated in order to form the transformer 225. While the illustrated embodiment in FIG. 2B shows that the primary inductor and the secondary inductor both include two conductive coils 226, embodiments are not limited to such configurations. For example, each inductor may be formed with one or more conductive coils 226.

Figure 3A:
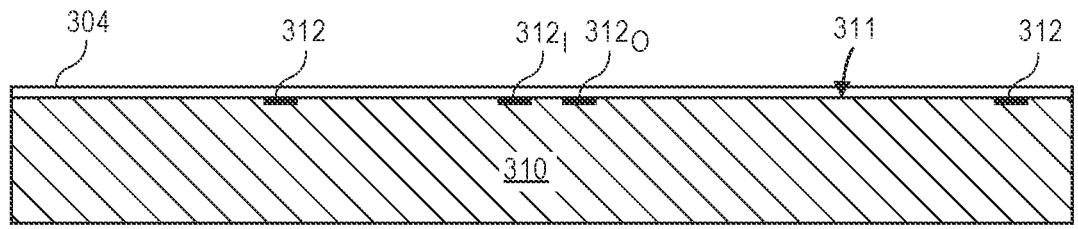
FIGS. 3A-3I are cross-sectional illustrations of processing operations that may be used to form a microelectronic device with an inductor formed around a core, according to an embodiment of the invention.

Referring now to FIGS. 3A-3I, cross-sectional illustrations of various processing operations for forming a vertically oriented inductor are shown. In FIG. 3A, a semiconductor die 310 is shown. The semiconductor die 310 may include active device circuitry (not shown). Additionally, die contact $312_I$ may be used as an input contact for an inductor and die contact $312_O$ may be used as an output contact for the inductor. A plurality of die contacts 312 may be provided to allow for solder bumps to be electrically coupled to the device circuitry. According to an embodiment, a first dielectric layer 304 has been formed over a surface 311 of the semiconductor die 310. By way of example, the first dielectric layer 304 may be a polymer material, such as, for example, polyimide, epoxy, or ABF.

Figure 3B:
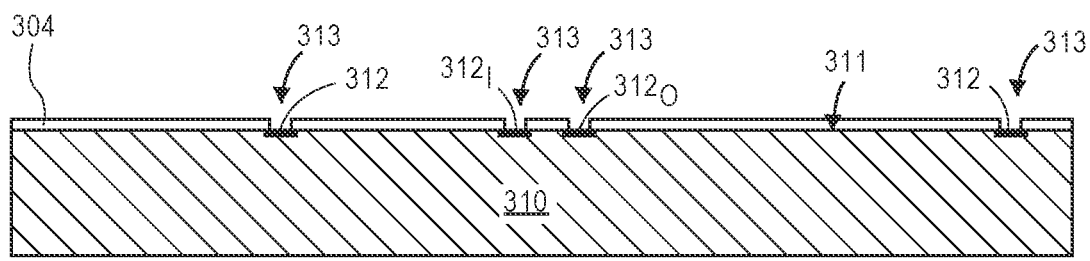

Referring now to FIG. 3B, embodiments of the invention include forming a plurality of first via openings 313 through the first dielectric layer 304. The openings 313 may be formed above one or more of the contacts 312. In an embodiment the first via openings 313 are formed with a lithographic etching operation or by a laser.

Figure 3C:
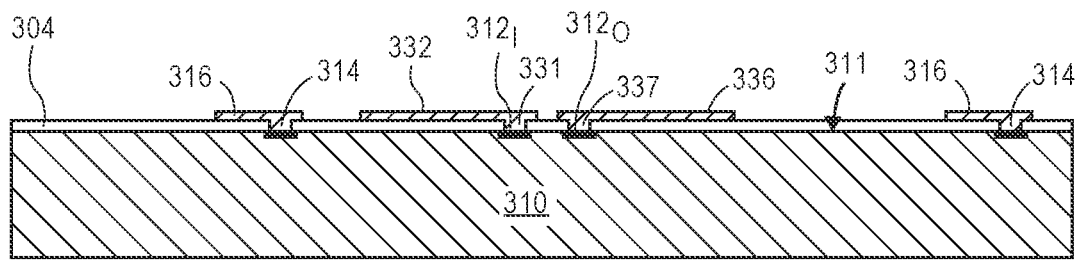

Referring now to FIG. 3C, embodiments of the invention include forming a plurality of conductive vias 314 in each of the first via openings 313 over die contacts 312. Additionally, a first via 331 and a fourth via 337 may be formed over the inductor input contact $312_I$ and the inductor output contact $312_O$, respectively. As such, the input vias and the output vias used for the inductor may be formed with the same processing operations used to form the conductive vias 314. According to an embodiment, a first redistribution layer 316 may be formed over the first dielectric layer 304. Additionally, a first trace 332 and a third trace 336 may be formed over the first dielectric layer 304. As such, the first trace 332 and the third trace 336 may be formed with the same processing operations used to form the first redistribution layer 316. In an embodiment, the first redistribution layer 316, the first trace 332, the third trace 336, the first via 331, the fourth via 337, and the conductive vias 314 may be formed with a single processing operation. By way of example, the processing operation may be an electroplating operation, an electroless plating operation, a printing operation, a sputtering operation, or the like. In an embodiment, the processing operations used to form the conductive features may include sputtering a seed layer over the exposed surfaces. Thereafter, a plating resist layer may be applied over the seed layer and patterned. After the plating resist layer is patterned, a plating operation (e.g., an electroplating process) may form the conductive features. Following the formation of the conductive features, the plating resist may be removed. In an embodiment, the remaining portions of the seed layer that were covered by the plating resist may also be removed with an etching process. In an embodiment, the conductive traces, vias, and redistribution layers may be a conductive layer, such as a copper layer. Additional embodiments may include a single metal layer, a stack of different metal layers, or alloys. For example, the layers may include barrier layers, seed layers, or the like.

Figure 3D:
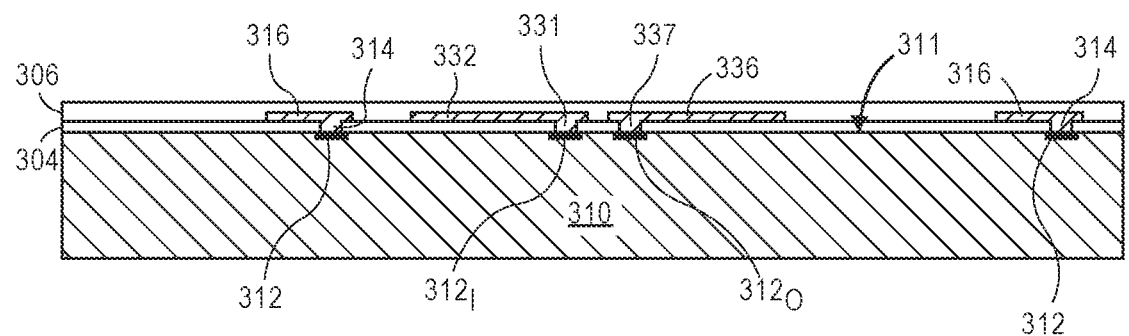

Referring now to FIG. 3D, embodiments of the invention include forming a second dielectric layer 306 over the first redistribution layer 316, the first trace 332, the third trace 336, and over the exposed portions of the first dielectric layer 304. In an embodiment, the second dielectric layer 306 may be any suitable dielectric. By way of example, the second dielectric layer 306 may be a polymer material, such as, for example, polyimide, epoxy, or ABF.

Figure 3E:
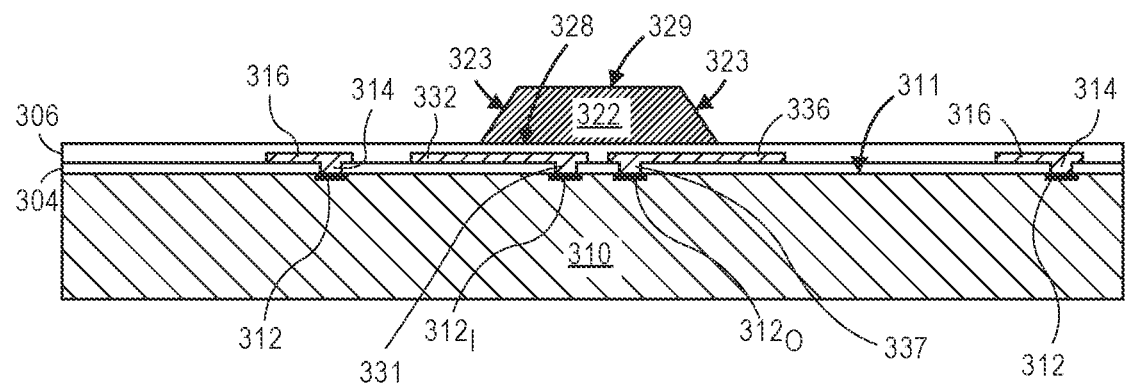

Referring now to FIG. 3E, embodiments include forming a core 322 over the second dielectric layer 306. According to an embodiment, a first surface 328 of the core 322 is in contact with the second dielectric layer 306 and includes sidewalls 323 extending away from the second dielectric layer 306 and ending at a second surface 329. While the illustrated embodiment shows the second surface 329 as being substantially parallel with the first surface 328, it is to be appreciated that embodiments are not limited to such configurations. For example, the second surface 329 may be rounded. As illustrated, the core 322 has non-vertical sidewalls 323, but embodiments are not limited to such configurations. Sloped sidewalls 323 may be desirable when the core 322 is formed with a screen printing operation. In such embodiments, the stencil used for the printing operation may include a sloped sidewall to allow for relief when removing the stencil from the surface. Accordingly, the shape and/or slope of the sidewalls may be dependent on the material used for the core 322 and the process used to deposit the core 322. Therefore, embodiments of the invention are not limited to the shape of the core 322 illustrated in the figures.

In an embodiment, the core may be formed with one or more materials. For example, the core 322 may be a composite material. By way of example, the composite matrix may be epoxy, polyimide, benzocyclobutene (BCB), or the like, and filler materials for the composite may include ferrites (e.g., NiZn ferrites, or MnZn ferrites), or magnetic particles or nanoparticles that include one or more of Ni, Fe, or Co. Additional embodiments of the invention may include a single material for the core 322. For example, the core may be Ni or Co. It is to be appreciated that when the core 322 is made from a conducting material (e.g., bulk Ni, Co, or Fe), an additional dielectric or insulating layer needs to be formed over surfaces of the core 322 that would otherwise contact the conductive coil in order to prevent short-circuiting the inductor. In an embodiment, the core 322 may be deposited onto the surface of the second dielectric layer 306 with a screen printing process, a jet printing process, a sputtering process, or the like.

It is to be appreciated that the order of the processing operations for forming the second dielectric layer 306 and the core 322 may be reversed. In such embodiments, the first surface 328 of the core 322 may be formed over and in contact with the first trace 332 and the third trace 336. Additionally, the second dielectric layer 306 may be formed over the sidewalls 323 and the second surface 329 of the core 322. Such an embodiment would, thereafter follow substantially similar processing operations to those described herein and result in a device substantially similar to the one illustrated in FIG. 1B.

Figure 3F:
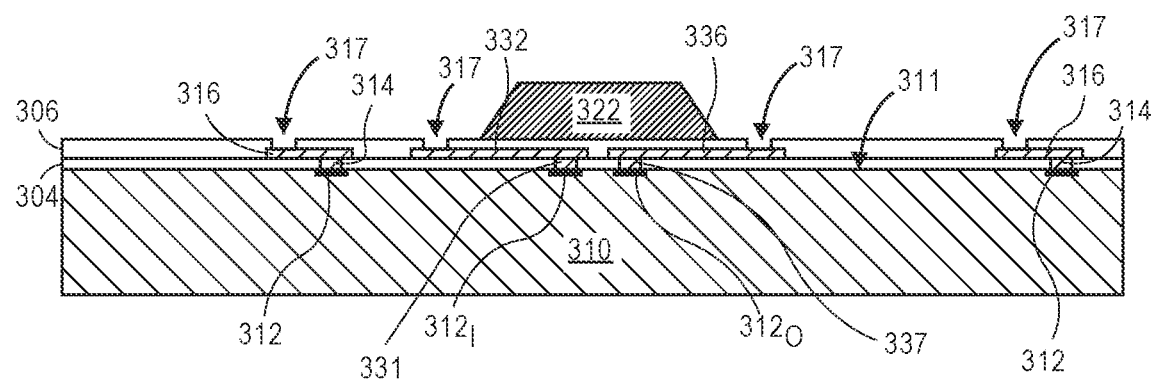

Referring now to FIG. 3F, embodiments of the invention include forming second via openings 317 through the second dielectric layer 306. In an embodiment the second via openings 317 are formed with a lithographic etching operation, or by a laser. Embodiments of the invention include forming openings above one or more of the first redistribution lines 316. Additionally, embodiment include forming openings 317 above the first trace 332 and the third trace 336.

Though not shown in the embodiment illustrated in FIG. 3F, embodiments of the invention may also include laser drilling through the core 322, to form openings for through core vias, such as those illustrated in FIG. 1C. After formation of the through core vias, the processing operations used to form the microelectronic device in FIG. 1C are substantially similar to those described with respect to FIGS. 3A-3I, and therefore, will not be repeated here.

Figure 3G:
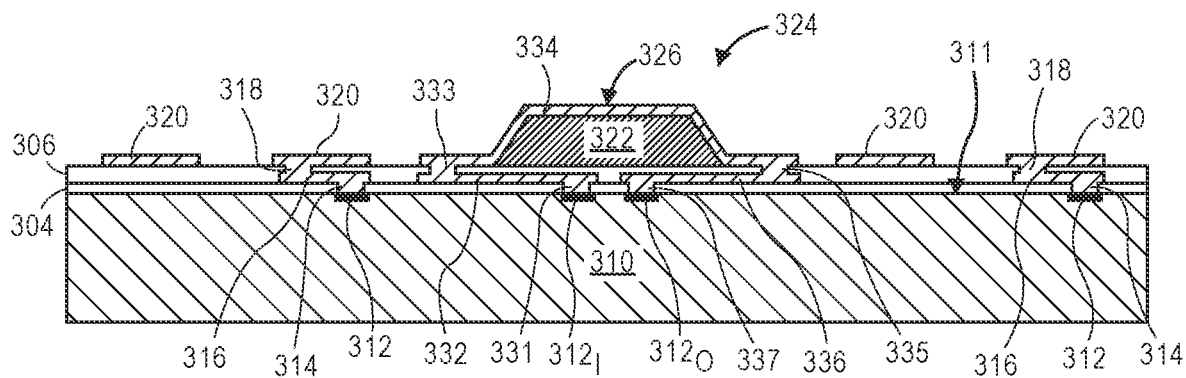

Referring now to FIG. 3G, embodiments of the invention include forming conductive vias 318 in one or more of the openings 317 and forming a second redistribution layer 320 over the second dielectric layer 306. Additionally, a second via 333 and a third via 335 may be formed in the openings 317 formed over the first trace 332 and the third trace 336, respectively. In an embodiment, a second trace 334 that electrically couples the second via 333 to the third via 335 may be formed in order to complete the conductive coil 326 of the inductor 324.

According to an embodiment, the conductive coil 326 may comprise a plurality of traces and vias formed around the core 322. In the embodiment illustrated in FIG. 3G, the conductive coil 326 comprises a first conductive via 331, a first trace 332, a second conductive via 333, a second conductive trace 334, a third conductive via 335, a third conductive trace 336, and a fourth conductive via 337. In embodiments, the core 322 increases the area enclosed by the conductive coil by causing a portion of the second trace 334 to be diverted away from the second dielectric layer 306 in the Z-direction. In the illustrated embodiment, the second trace 334 is formed partially along the second dielectric layer 306, along the sidewalls 323, and over the second surface 329 of the core 322. In such embodiments, the area enclosed by the conductive coil 326 may comprise the cross-sectional area of the core 322 and a portion of the second dielectric layer 306, as illustrated in FIG. 3G. The area enclosed by the conductive coil 326 can be increased or decreased by altering the geometry of the core 322. For example, a thickness of the core 322, the width of the core 322, and/or the slope/shape of the sidewalls 323 may be modified to provide a desired inductivity for the inductor 324.

In an embodiment, the second redistribution layer 320, the second trace 334, the second via 333, the third via 335, and the conductive vias 318 may be formed with the same processing operation. By way of example, the processing operation may be an electroplating operation, an electroless plating operation, a printing operation, a sputtering operation, or the like. In an embodiment, the conductive traces, vias, and redistribution layers may be a conductive layer, such as a copper layer. Additional embodiments may include a single metal layer, a stack of different metal layers, or alloys. For example, the layer may include barrier layers, seed layers, or the like.

Figure 3H:
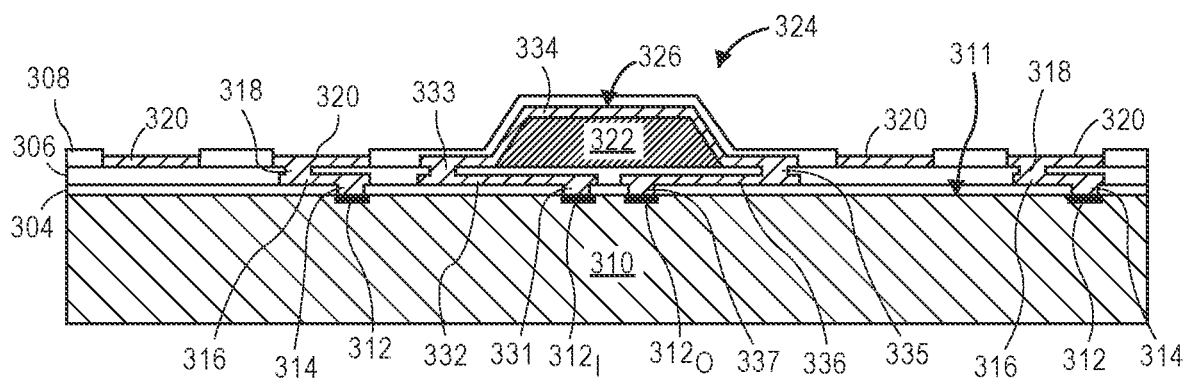
Figure 3I:
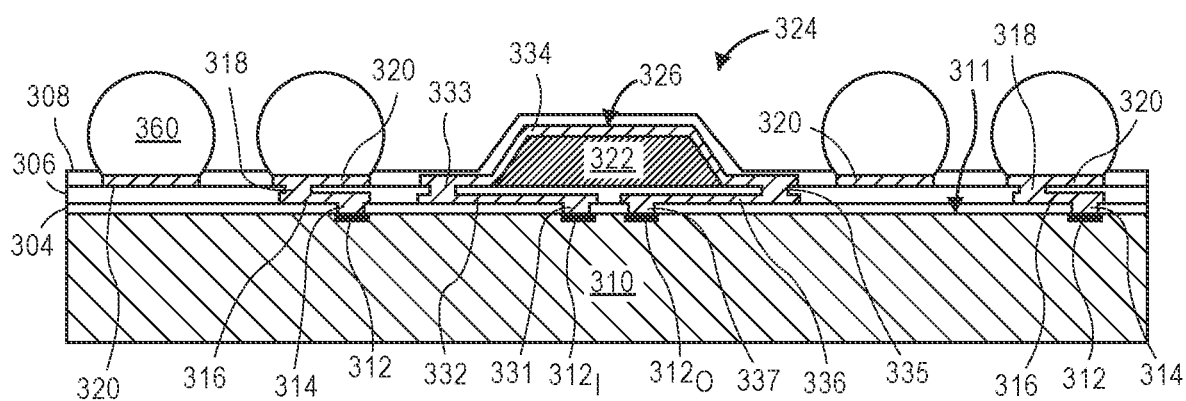

Referring now to FIG. 3H, embodiments of the invention include forming a solder resist layer 308 over the second redistribution layer 320. The solder resist layer 308 electrically isolates the second redistribution layer 320 and the second trace 334, and also may provide protection from corrosion. In an embodiment, the solder resist layer 308 is patterned to provide openings for attaching solder bumps. As illustrated in FIG. 3I, solder balls 360 may be placed on the exposed portions of the second redistribution layer 320. By way of example, the solder balls 360 may be formed on the second redistribution layer 320 with a printing operation, an electroplating operation, a jetting operation, or as preformed balls, e.g. with a pick-and-place operation, or the like.

In addition to forming an inductor around a core that is fabricated during processing operations used for forming redistribution layers, embodiments of the invention may also include a packaged inductor. According to an embodiment, packaged inductors may be attached to the microelectronic device with a flip-chip bonding process. Whereas wirebonding may not be used over the active surface of the semiconductor die because of the risk of cracking the low-k interlayer dielectrics of the BEOL stack, flip-chip bonding may be utilized because the process induces less stress on the BEOL stack. FIGS. 4A-4D are cross-sectional illustrations of microelectronic devices that include packaged inductors, according to various embodiments of the invention.

Figure 4A:
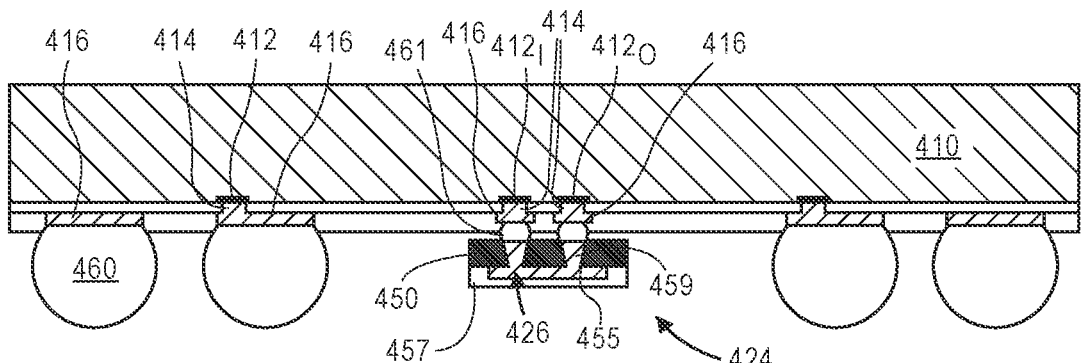
FIG. 4A is a cross-sectional illustration of a microelectronic device with a packaged inductor that has a first routing layer, according to an embodiment of the invention.

Referring now to FIG. 4A, a microelectronic device with a packaged inductor 424 is illustrated according to an embodiment of the invention. As illustrated, the semiconductor device 400 is substantially similar to those described above in FIG. 1A with the exception that the conductive coil 426 of the inductor 424 is formed at least partially in a packaged component. According to an embodiment, the conductive coil 426 includes a routing layer 455, and vias 459. The routing layer 455 and the vias 459 are a conductive material. According to an embodiment, the routing layer 455 and the vias 459 may include a single metal layer, a stack of different metal layers, or alloys. For example, the routing layer 455 and the vias 459 may include barrier layers, seed layers, or the like. According to an embodiment, the vias 459 may be formed through a dielectric layer 450. For example, the openings for the vias may be laser drilled through the dielectric layer 450. According to an embodiment of the invention, the dielectric layer 450 may be any suitable dielectric material. For example, the dielectric may be a resin (e.g., a BT resin), an epoxy, or an epoxy composite (e.g., FR4). Embodiments of the invention may also include a solder mask or protective layer 457 that is formed over the routing layer 455. Providing a solder mask 457 over the routing layer 455 may protect the routing layer 455 from oxidation.

According to an embodiment, the vias 459 may be electrically coupled to die contacts 412 formed on the semiconductor die 410. In the illustrated embodiment, the vias 459 are electrically coupled to a redistribution layer 416 on the semiconductor die 410 by solder bumps 461. The solder bumps 461 may be suitable solder bumps for flip-chip bonding. For example, the solder bumps 461 may be controlled collapse chip connection (C4) bumps. Embodiments of the invention include one or more additional redistribution layers or vias 414 that electrically couple redistribution layer 416 to the die contacts 412 to complete the conductive coil 426 of the inductor 424. According to an additional embodiment of the invention, the solder bumps 461 may be directly connected to the die contacts 412, and the redistribution layers 416 and vias 414 may be omitted.

Figure 4B:
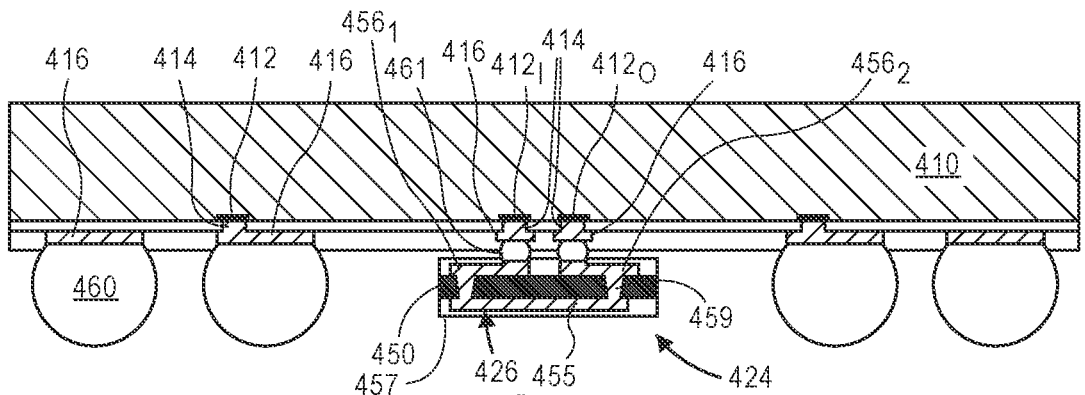
FIG. 4B is a cross-sectional illustration of a microelectronic device with a packaged inductor that has a first routing layer and a second routing layer, according to an embodiment of the invention.

Referring now to FIG. 4B, an illustration of a microelectronic device with a packaged inductor 424 according to an additional embodiment of the invention is shown. The packaged inductor in FIG. 4B is substantially similar to the packaged inductor in FIG. 4A, with the exception that a second routing layer 456 is formed on the surface of the dielectric layer 450 opposite from the surface on which the first routing layer 455 is formed. The second routing layer 456 includes a first trace $456_1$ and a second trace $456_2$. Each trace is electrically coupled to one of the vias 459. The inclusion of a second routing layer 456 provides additional flexibility in the design of the inductor 424. For example, the second routing layer 456 allows for the spacing of the vias 459 to be different than the spacing of the die contacts 412. Accordingly, the second routing layer 456 allows for the area enclosed by the conductive coil 426 to be increased.

Figure 4C:
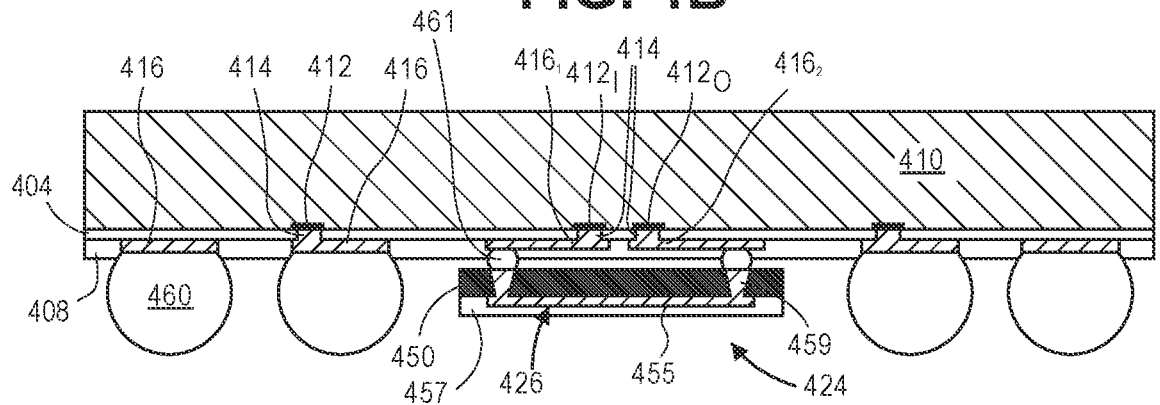
FIG. 4C is a cross-sectional illustration of a microelectronic device with a packaged inductor that has a first routing layer and is attached to a first redistribution layer on a semiconductor, according to an embodiment of the invention.

Referring now to FIG. 4C, an illustration of a microelectronic device with a packaged inductor 424 according to an additional embodiment of the invention is shown. The packaged inductor in FIG. 4C allows for the area enclosed by the conductive coil 426 to be increased without a second routing layer 456 formed on the packaged inductor. Instead, embodiments of the invention include a redistribution layer 416 formed over the first dielectric layer 404 of the semiconductor die 410. The redistribution layer 416 includes a first trace $416_1$ and a second trace $416_2$. Each trace is electrically coupled to the packaged inductor 424 by a solder bump 461. Accordingly, embodiments of the invention include portions of the conductive coil 426 that are formed on the semiconductor die 410 instead of on the packaged inductor 424. Additionally, the inclusion of a redistribution layer 416 provides additional flexibility in the design of the inductor 424. For example, the redistribution layer 416 allows for the spacing of the vias 459 to be different than the spacing of the die contacts 412. Accordingly, the redistribution layer 416 allows for the area enclosed by the conductive coil 426 to be increased.

Figure 4D:
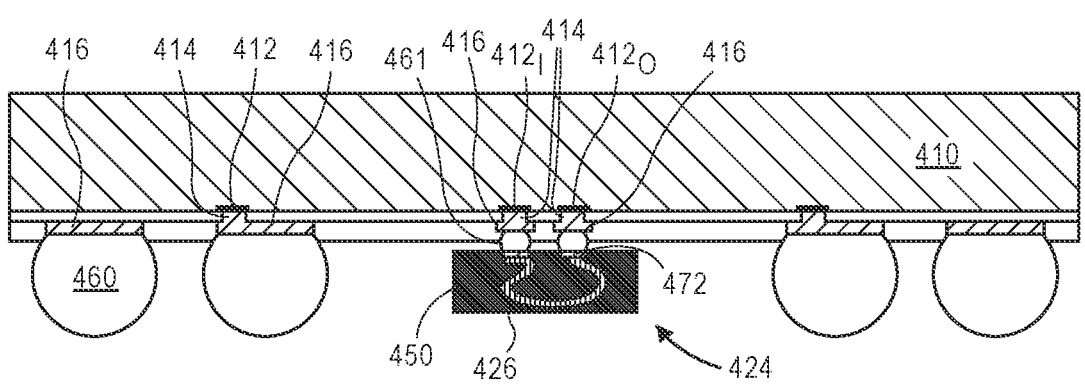
FIG. 4D is a cross-sectional illustration of a microelectronic device with a packaged inductor that is a wire-bonded inductor, according to an embodiment of the invention.

Referring now to FIG. 4D, an illustration of a microelectronic device with a packaged inductor 424 according to an additional embodiment of the invention is shown. According to an embodiment, the packaged inductor 424 may include a conductive coil 426 that is wire bonded. Whereas wirebonding described above is not acceptable for use because wirebonding induces too much stress that may fracture the low-k dielectric materials of the BEOL stack, embodiments of the present invention perform the wirebonding process prior to connecting the packaged inductor 424 to the semiconductor die 410. As illustrated, the conductive coil 426 is wirebonded to pads 472 formed in a substrate layer 450. Thereafter, the contact pads 472 may be flip-chip bonded to the die contacts 412 of the semiconductor die 410. The flip-chip bonding induces less stress on the BEOL stack, and therefore does not result in the cracking of low-k dielectric materials.

Figure 5A:
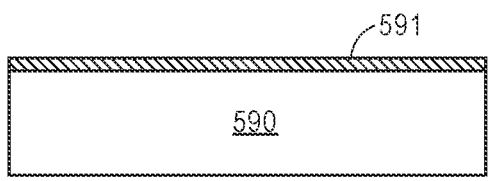
FIGS. 5A-5F are cross-sectional illustrations of processing operations that may be implemented to form a wire-bonded packaged inductor, according to embodiments of the invention.

Wire bonded packaged inductors, such as those illustrated in FIG. 4D may be formed by processes, such as those illustrated in FIGS. 5A-5F. Referring now to FIG. 5A, a plating base layer 591 is formed over a carrier 590. According to an embodiment, the carrier 590 is a reusable substrate. For example, the carrier 590 may be a glass substrate. Embodiments include a plating base layer 591 that is removable from the carrier 590 in order to allow for the packaged inductor to be removed from the carrier 590 after it has been formed.

Figure 5B:
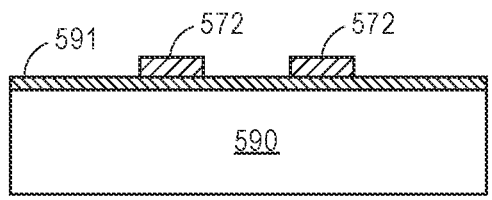

Referring now to FIG. 5B, embodiments of the invention include forming contact pads 572 on the plating base layer 591. In an embodiment, the contact pads 572 may be formed with an electrodeposition and etching process or any other suitable process. By way of example, the contact pads 572 may include a single metal layer, a stack of different metal layers, or alloys. For example, the contact pads 572 may include barrier layers, seed layers, or the like.

Figure 5C:
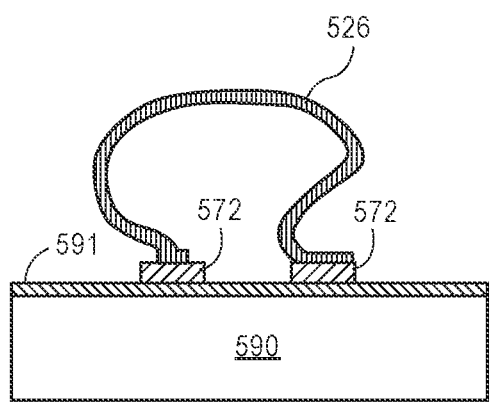

Referring now to FIG. 5C, embodiments include forming a conductive coil 526 between the two contact pads 572. According to an embodiment, each end of the conductive coil 526 is wirebonded to a contact pad 572. Since the wire bonding process is not performed on the surface of the semiconductor die, the increased stress attributable to the wirebonding process will not be experienced by the BEOL stack. The conductive coil 526 may be any conductive material typically used in wire bonding processes. By way of example, the conductive coil may be copper, silver, gold, aluminum, or alloys thereof.

Figure 5D:
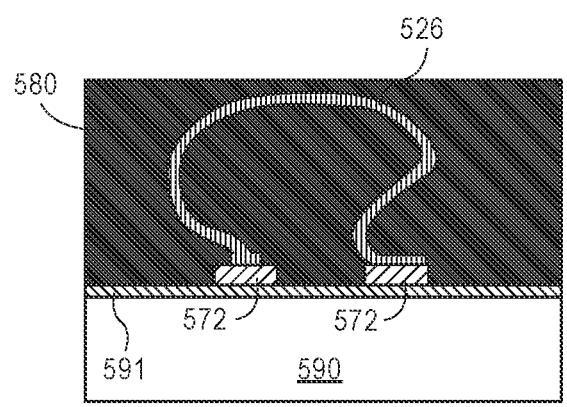

Referring now to FIG. 5D, embodiment of the invention include forming an inductor substrate 580 around the conductive coil and over the contact pads 572. The inductor substrate 580 may be formed around and inside the conductive coil 526. In an embodiment, the inductor substrate 580 may be formed with a molding compound. By way of example, the molding compound may be a resin (e.g., a BT resin), an epoxy, or an epoxy composite (e.g., FR4).

Figure 5E:
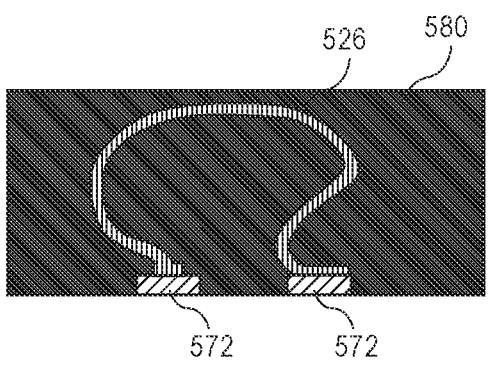
Figure 5F:
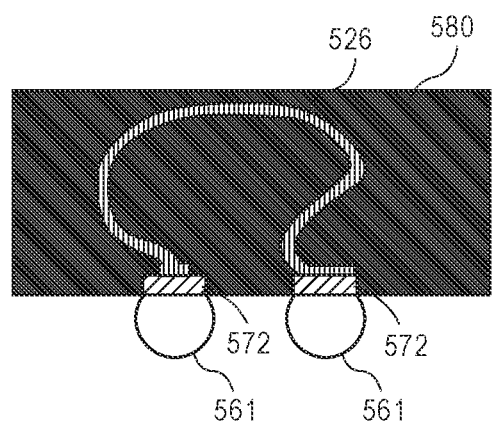

Referring now to FIG. 5E, embodiments of the invention include removing the carrier 590 from the plating base layer 591, for example, with a delamination process. Embodiments may also include removing the plating base layer 591 to expose the contact pads 572. By way of example, the plating base layer 591 may be removed with an etching process. Referring now to FIG. 5F, embodiments of the invention include applying solder bumps 561 to the contact pads 572. By way of example, the solder bumps 561 may be formed on the contact pads 572 with a printing operation, electroplating operation, a jetting operation, or as preformed balls, e.g. with a pick-and-place operation, or the like.

Figure 6:
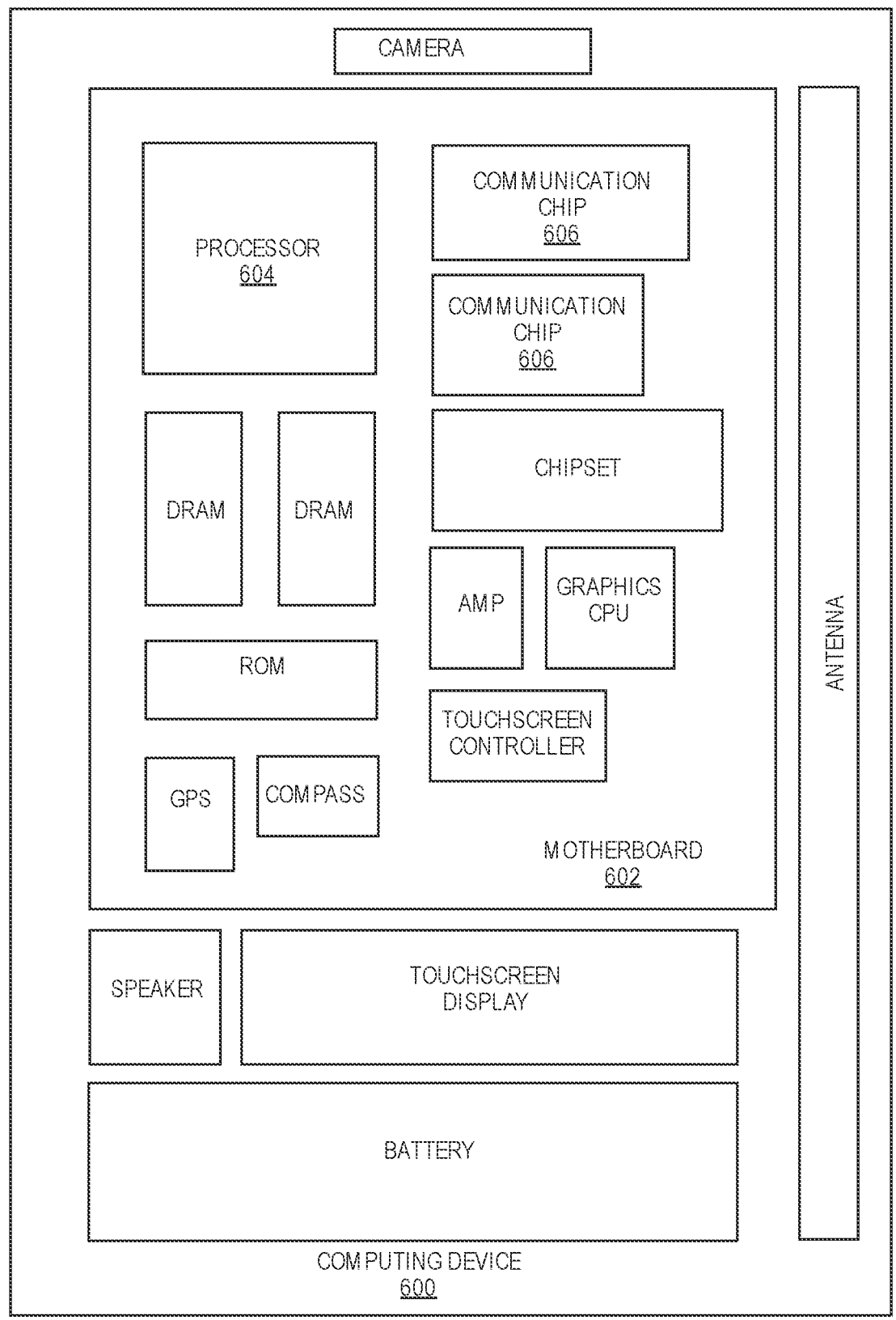
FIG. 6 is a schematic of a computing device that includes one or more microelectronic devices with one or more inductors formed, in accordance with an embodiment of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as devices that include a first level interconnect that include a barrier layer of Zn-based IMCs in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as devices that include a first level interconnect that include a barrier layer of Zn-based IMCs in accordance with implementations of the invention.

Embodiments of the invention include a microelectronic device, comprising: a semiconductor die; and an inductor electrically coupled to the semiconductor die, wherein the inductor includes one or more conductive coils that extend away from a surface of the semiconductor die.

Additional embodiments of the invention include a microelectronic device, wherein the one or more conductive coils are formed around a core.

Additional embodiments of the invention include a microelectronic device, wherein the one or more conductive coils comprise a plurality of traces electrically coupled to each other by one or more vias.

Additional embodiments of the invention include a microelectronic device, wherein the plurality of traces in the conductive coil comprises a first trace and a third trace formed over a first dielectric layer and a second trace formed over a second dielectric layer and over the core, and wherein a first via through the second dielectric layer couples the first trace to the second trace, and a second via through the second dielectric layer couples the second trace to the third trace.

Additional embodiments of the invention include a microelectronic device, wherein a first trace and a third trace are formed over a first dielectric layer and a second trace is formed over the core, and wherein a first via through the core couples the first trace to the second trace and a second via through the core couples the second trace to the third trace.

Additional embodiments of the invention include a microelectronic device, wherein the first via and the second via are also formed through a second dielectric layer.

Additional embodiments of the invention include a microelectronic device, wherein a first surface of the core is formed over and in contact with the first trace and the third trace, and the second dielectric layer is formed over sidewalls and a second surface of the core.

Additional embodiments of the invention include a microelectronic device, wherein the plurality of traces in the conductive coil comprises a first trace and a third trace formed in a back end of line stack of the semiconductor die and a second trace formed over a first dielectric layer and over the core, and wherein a first via through the first dielectric layer electrically couples the first trace to the second trace, and a second via through the first dielectric layer electrically couples the second trace to the third trace.

Additional embodiments of the invention include a microelectronic device, wherein the core is a magnetic material.

Additional embodiments of the invention include a microelectronic device, wherein the core is nickel or cobalt.

Additional embodiments of the invention include a microelectronic device, wherein the core is a composite material.

Additional embodiments of the invention include a microelectronic device, wherein the composite material include a polymer matrix comprising epoxy, polyimide, benzocyclobutene (BCB), and a filler material comprising nickel-zinc ferrites, manganese-zinc ferrites, nickel, iron, or cobalt.

Additional embodiments of the invention include a microelectronic device, further comprising a second inductor interdigitated with the first inductor to form a transformer.

Additional embodiments of the invention include a microelectronic device, wherein the inductor is electrically coupled to the semiconductor die with solder balls.

Additional embodiments of the invention include a microelectronic device, wherein the inductor comprises a dielectric layer having a first via and a second via electrically coupled to each other with a conductive trace, and wherein the first via and the second via are electrically coupled to the solder balls.

Additional embodiments of the invention include a microelectronic device, wherein the solder balls are coupled to a first redistribution line and a second redistribution line formed on the semiconductor die.

Additional embodiments of the invention include a microelectronic device, wherein the inductor comprises a dielectric layer having a first via and a second via electrically coupled to each other with a first conductive trace, and first redistribution line coupled to the first via and a second redistribution line coupled to the second via, wherein each of the first and second redistribution lines are formed on a surface of the inductor substrate opposite the surface the first conductive trace, and wherein the first and second redistribution lines are electrically coupled to the solder balls.

Additional embodiments of the invention include a microelectronic device, wherein the inductor comprises a dielectric layer having a first contact pad and a second contact pad that are electrically coupled to each other by a wirebonded conductive coil formed in the dielectric layer, and wherein the first and second contact pads are electrically coupled to the solder balls.

Embodiments of the invention may also include a method of forming an inductor on a microelectronic device, comprising: forming an inductor input opening and an inductor output opening through a first dielectric layer formed over a surface of a semiconductor die to expose an inductor input contact and an inductor output contact that are formed on the surface of the semiconductor die; forming a first via through the inductor input opening and a fourth via through the inductor output opening; forming a first trace and a third trace over the first dielectric layer, wherein the first trace is electrically coupled to the inductor input contact by the first via and the third trace is electrically coupled to the inductor output contact by the fourth via; forming a second dielectric layer over the first dielectric layer, the first trace, and the third trace; forming a core over the first trace and the third trace; forming a second via and a third via through the second dielectric layer, the second via electrically coupled to the first trace and the third via electrically coupled to the third trace; and forming a second trace over the core and the second dielectric layer, wherein the second trace is electrically coupled to the second via and the third via. Additional embodiments of the invention include a method of forming an inductor on a microelectronic device, further comprising forming a solder mask layer over the second dielectric layer and over the second trace.

Additional embodiments of the invention include a method of forming an inductor on a microelectronic device, wherein the second dielectric layer is formed subsequent to forming the core, and wherein the core is in contact with the first trace and the third trace.

Additional embodiments of the invention include a method of forming an inductor on a microelectronic device, wherein the core is formed with a screen printing process, a jet printing process, or a sputtering process.

Additional embodiments of the invention include a method of forming an inductor on a microelectronic device, wherein the core is a magnetic material.

An embodiment of the invention includes a method of forming an inductor on a microelectronic device, comprising: forming an inductor input opening and an inductor output opening through a first dielectric layer formed over a surface of a semiconductor die to expose an inductor input contact and an inductor output contact that are formed on the surface of the semiconductor die; forming a first via through the inductor input opening and a fourth via through the inductor output opening; forming a first trace and a third trace over the first dielectric layer, wherein the first trace is electrically coupled to the inductor input contact by the first via and the third trace is electrically coupled to the inductor output contact by the fourth via; forming a second dielectric layer over the first dielectric layer, the first trace, and the third trace; forming a core over the first trace and the third trace; forming a first via and a second via through the core; and forming a second trace over the core that is electrically coupled to the first through core via and the second through core via.

Additional embodiments of the invention include a method of forming an inductor on a microelectronic device, wherein the opening in which the first through core via and the second through core via are formed are formed with a laser ablation process.

What is claimed is:

1. An inductor structure, comprising:
   a first contact pad laterally spaced apart from a second contact pad;
   a conductive coil coupling the first contact pad to the second contact pad; and
   a molding compound over the first contact pad, over the second contact pad, and over the conductive coil, the molding compound completely laterally surrounding the first contact pad, completely laterally surrounding the second contact pad, and laterally surrounding the conductive coil, wherein the molding compound has a bottommost surface at a same level as a bottommost surface of the first contact pad and a bottommost surface of the second contact pad.

2. The inductor structure of claim 1, wherein the conductive coil is a wire.

3. The inductor structure of claim 1, further comprising:
a first solder ball coupled to the first contact pad on a side of the first contact pad opposite the conductive coil; and
a second solder ball coupled to the second contact pad on a side of the second contact pad opposite the conductive coil.

4. The inductor structure of claim 1, wherein the molding compound comprises an epoxy compound.

5. An integrated circuit structure, comprising:
a semiconductor die; and
an inductor structure coupled to the semiconductor die, the inductor structure comprising:
a first contact pad laterally spaced apart from a second contact pad;
a conductive coil coupling the first contact pad to the second contact pad; and
a molding compound over the first contact pad, over the second contact pad, and over the conductive coil, the molding compound completely laterally surrounding the first contact pad, completely laterally surrounding the second contact pad, and laterally surrounding the conductive coil, wherein the molding compound has a bottommost surface at a same level as a bottommost surface of the first contact pad and a bottommost surface of the second contact pad.

6. The integrated circuit structure of claim 5, wherein the conductive coil is a wire.

7. The integrated circuit structure of claim 5, the inductor structure further comprising:
a first solder ball coupled to the first contact pad on a side of the first contact pad opposite the conductive coil; and
a second solder ball coupled to the second contact pad on a side of the second contact pad opposite the conductive coil.

8. The integrated circuit structure of claim 5, wherein the molding compound comprises an epoxy compound.

9. A computing device, comprising:
a board; and
a component coupled to the board, the component including an integrated circuit structure, the integrated circuit structure comprising:
a semiconductor die; and
an inductor structure coupled to the semiconductor die, the inductor structure comprising:
a first contact pad laterally spaced apart from a second contact pad;
a conductive coil coupling the first contact pad to the second contact pad; and
a molding compound over the first contact pad, over the second contact pad, and over the conductive coil, the molding compound completely laterally surrounding the first contact pad, completely laterally surrounding the second contact pad, and laterally surrounding the conductive coil, wherein the molding compound has a bottommost surface at a same level as a bottommost surface of the first contact pad and a bottommost surface of the second contact pad.

10. The computing device of claim 9, further comprising:
a memory coupled to the board.

11. The computing device of claim 9, further comprising:
a communication chip coupled to the board.

12. The computing device of claim 9, further comprising:
a battery coupled to the board.

13. The computing device of claim 9, wherein the component is a packaged integrated circuit die.

* * * * *